United States Patent [19]
Calligaro et al.

[11] Patent Number: 5,777,460
[45] Date of Patent: Jul. 7, 1998

[54] VOLTAGE STEP-UP CIRCUIT WITH OUTPUT VOLTAGE REGULATION

[75] Inventors: Cristiano Calligaro; Piero Malcovati; Guido Torelli, all of Pavia, Italy

[73] Assignee: SGS-Thomson Microelectronics S.r.l., Agrate Brianza, Italy

[21] Appl. No.: 846,539

[22] Filed: Apr. 29, 1997

Related U.S. Application Data

[63] Continuation of Ser. No. 292,343, Aug. 17, 1994, abandoned.

[30] Foreign Application Priority Data

Aug. 18, 1993 [EP] European Pat. Off. ............ 93830353.4

[51] Int. Cl.[6] .................................................... G11C 7/00
[52] U.S. Cl. .................................................... 323/222
[58] Field of Search ............... 361/54–57; 327/543, 327/544, 73–74, 334, 603; 323/282, 273, 274, 222; 331/8, 17, 25; 365/189, 226; 307/106–107; 363/311–313

[56] References Cited

U.S. PATENT DOCUMENTS

| | | | |
|---|---|---|---|
| 4,817,055 | 3/1989 | Arakawa et al. | 307/297 |
| 5,162,668 | 11/1992 | Chen et al. | 307/296.8 |

FOREIGN PATENT DOCUMENTS

| | | | |
|---|---|---|---|
| 0 213 503 | 8/1985 | European Pat. Off. | G11C 5/00 |
| 0 386 282 | 9/1990 | European Pat. Off. | G11C 11/407 |

OTHER PUBLICATIONS

Davis, "Charge Pump Powers High–Side Switch," *EDN* 36(23):276–278, 1991.

*Primary Examiner*—Aditya Krishnan
*Attorney, Agent, or Firm*—David V. Carlson; Bryan A. Santarelli; Seed and Berry LLP

[57] ABSTRACT

A voltage step-up circuit with regulated output voltage, comprises a voltage divider and a current-absorption circuit connected between the output terminal of the circuit and ground. A control circuit connected to the divider drives the switching of the current-absorption circuit.

22 Claims, 1 Drawing Sheet

VOLTAGE STEP-UP CIRCUIT WITH OUTPUT VOLTAGE REGULATION

CROSS-REFERENCE TO RELATED APPLICATION

This application is a continuation of U.S. patent application Ser. No. 08/292,343, filed Aug. 17, 1994, now abandoned.

TECHNICAL FIELD OF THE INVENTION

This invention relates to voltage step-up circuits.

1. Background of the Invention

In memory cell circuits, the memory cell must be supplied a drain voltage which must be constant as far as possible while the drain current drawn by the cell varies.

This technical problem becomes specially important where a single voltage step-up circuit is employed for programming a group of memory cells, and the overall current draw variations increase.

The arrangements adopted heretofore to provide adequate stability for the output voltage of a voltage step-up circuit consist basically of providing a Zener diode, or a series of diodes or diode-connected transistors, between the output terminal of the voltage step-up circuit and a reference potential, usually a ground potential.

However, where high output voltages are involved, say on the order of ten volts, the implementation of a Zener diode in CMOS technology becomes difficult, whereas the use of a diode chain—which would have to include five or six diodes—may bring about significant deviations from nominal values due to variations in the technological process parameters.

2. Summary of the Invention

An object of the present invention is, therefore, to provide a voltage step-up circuit which can be integrated in CMOS technology and be regulated even at high output voltages. Another object is that the voltage step-up circuit output should be regulated using simple circuit arrangements, so that the incorporation of several such voltage step-up circuits to memory cell devices would lead to no excessive expansion of the integration area.

The present invention provides a voltage step-up circuit which can be integrated monolithically in CMOS technology and used to drive the drain of a field-effect transistor of a memory cell during the programming phase. Overall, the present invention provides a voltage step-up circuit of the type described and characterized in the appended claims to this specification.

The features and advantages of a step-up circuit according to the invention will become apparent from the following detailed description of an embodiment thereof, given by way of example and not of limitation with reference to the accompanying drawings.

DETAILED DESCRIPTION OF THE INVENTION

Figure 1:
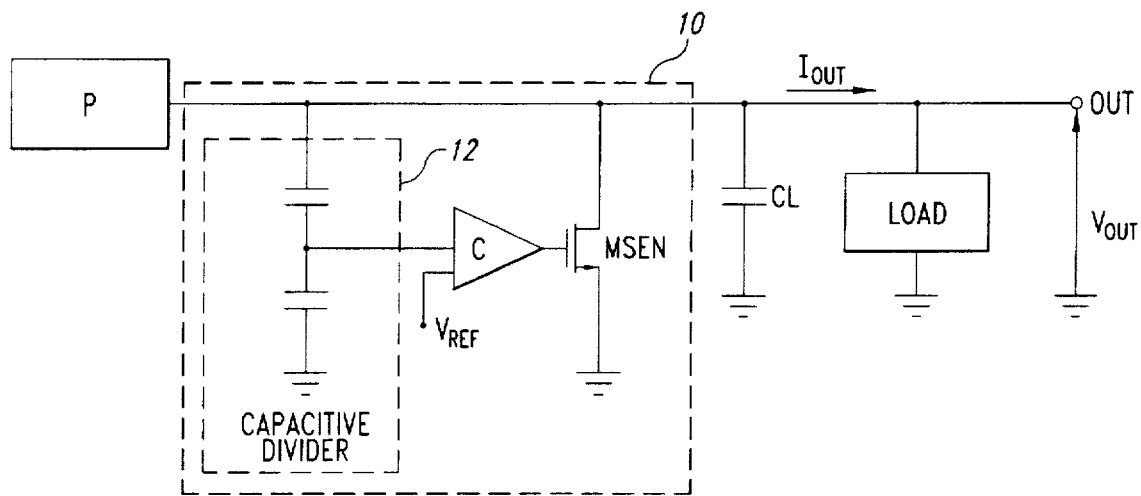
FIG. 1 shows a diagram, partly in block form, of a voltage step-up circuit with regulated output voltage according to the invention.

The diagram of a voltage step-up circuit according to the invention, shown in FIG. 1, comprises a block P marked symbolically to indicate conventional functional parts of a voltage step-up circuit, usually a charge pump circuit, having at least one output terminal OUT to which there would be connected a load, in parallel with a capacitor CL, to be supplied a constant high voltage.

The diagram includes, according to the invention, an output voltage regulator block 10, shown in dash outline, which comprises a closed loop control circuit. It further includes a capacitive divider 12 connected between the output terminal OUT and ground, whereby the voltage from said functional parts which constitutes the output voltage of the step-up circuit is divided by a predetermined factor.

Connected to the divider 12 is a control circuit which is responsive to the voltage output from the divider and represented in FIG. 1 by a triangular block C. This control circuit C drives a transistor MSEN "on", but only upon the voltage exceeding a predetermined level. In such as case, the transistor MSEN, which is connected between the output terminal OUT and ground, would draw current from the charge pump P until the voltage drops to said predetermined level, at which the voltage will be held in the steady state condition. In the starting condition, of course, it should be possible to discharge the divider 12 capacitors.

If the division ratio of the divider 12 is $\beta$ and the predetermined voltage level is $V_{REF}$, then the regulated output voltage becomes, $$V_{OUT}=1\beta V_{REF}$$

In the diagram shown, the divider 12 is a capacitive type, such that power consumption can be minimized without excessive occupation of integration area. If a resistive divider 12 were employed to limit the current (to be supplied from the charge pump) drawn thereby to reasonable values, the use of very high-value resistors would be required. In conventional integration technologies, a high value resistor may occupy an area larger than that occupied by capacitors and thus capacitors are likely preferred.

The use of a capacitive divider 12 in an integrated circuit further affords a very accurate division ratio $\beta$.

In other applications, of course, the divider 12 could be composed of a different type of elements, such as resistors, high impedance transistors, or other appropriate divider elements. Polysilicon resistors or diodes of lightly doped or undoped polysilicon regions may also be used as the impedance devices for the dividers.

There are a number of different suitable arrangements that can be used for implementing the control circuit C, of which two are specially simple and advantageous. A first arrangement consists of using a comparator circuit, preferably of the threshold type, which can be implemented by conventional techniques. The output terminal of the comparator is connected to the control terminal of the transistor MSEN, an input terminal of the comparator is connected to the divider and another is connected to the reference voltage $V_{REF}$ which can be obtained using techniques well known to those skilled in the art.

Figure 2:
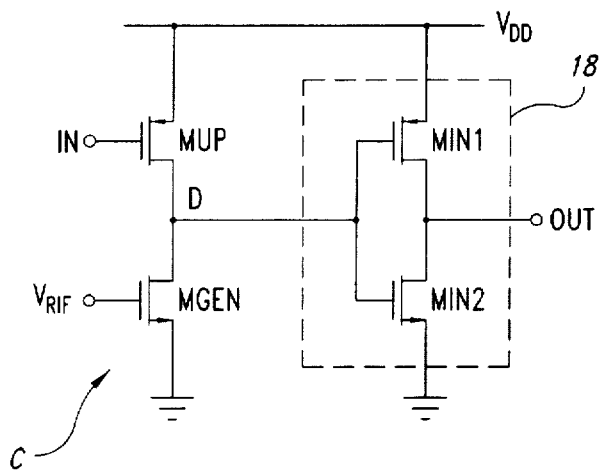
FIG. 2 shows a preferred circuit diagram for a control block C, as shown in FIG. 1, implemented in CMOS technology.

A second arrangement, which may be preferable where the voltage step-up circuit is implemented in the CMOS technology, is illustrated by FIG. 2. In this case, no comparator proper is used, and as can be seen from the diagram in FIG. 2, the control circuit is comprised of two cascaded stages, each comprising two mutually complementary transistors, MGEN, MUP and MIN1, MIN2.

The first stage comprises a generator of a current having a predetermined constant value (MGEN driven by the voltage $V_{RIF}$), which causes the node D to be charged toward a low voltage level when the transistor MUP is off or is delivering a lower current than MGEN (as would occur if the input node of the block C is at a sufficiently high level). When MUP is on and delivering a higher current than that from MGEN, the node D is brought to a voltage high (as would occur if the input node of the block C is not at a sufficiently high level). The node D drives the block second stage, consisting of a logic inverter 18 whose output, representing the output of the block C, drives the transistor MSEN of the regulator block in the voltage step-up circuit.

Thus, when the output voltage from the charge pump P is below a predetermined value (dependent on the value of $V_{RIF}$ and the size of the transistors in the block C), the output voltage from the block C will be low and the transistor "off", whereas when it is above that value, the transistor MSEN will be "on" and absorb a part of the current from the charge pump, as desired for regulating purposes. The voltage generated by the step-up circuit will, therefore, be regulated at a value which is dependent on the division ratio of the divider 12 and the values (including the voltage $V_{RIF}$) of the block C components.

The second arrangement is simpler than the first, circuit-wise. However, the voltage generated by the first arrangement can be made highly accurate, if a precision voltage $V_{REF}$ is available. The voltage generated by the second arrangement may be less accurate because of its more marked dependence on the parameters of the integrated circuit manufacturing process and the operating conditions (such as temperature and supply voltage).

The voltage regulation vis-a-vis the variations of the current drawn by the load is good with either arrangement.

It will be appreciated that modifications or integrations may be made unto the embodiments described hereinabove without departing from the protection scope of the appended claims. As an example, the two states of the control circuit in the second arrangement could be implemented in another technology using bipolar transistors. While various embodiments have been described in this application for illustrative purposes, the claims are not so limited. Rather, any equivalent method or design operating according to principles of the invention fall within the scope thereof.

We claim:

1. A voltage circuit that regulates a boosted voltage that is generated from a supply voltage, the supply voltage less than said boosted voltage, said boosted voltage provided between a circuit output terminal and ground, said voltage circuit comprising:
    a supply terminal that is coupled to receive said supply voltage;
    a voltage divider that is coupled between said supply terminal and ground, said divider having an intermediate terminal;
    a control circuit having a first input terminal coupled to said intermediate terminal, a second input terminal coupled to receive a reference voltage, and an output terminal; and
    a controllable current-absorption circuit coupled between said circuit output terminal and ground and having a control terminal coupled to said output terminal of said control circuit, said current-absorption circuit operable to draw a current from said circuit output terminal to ground when a voltage on said intermediate terminal is greater than a predetermined value, said current-absorption circuit operable to draw substantially zero current when said voltage on said intermediate terminal is less than said predetermined value.

2. The voltage circuit according to claim 1 wherein said divider comprises first and second capacitors connected serially together through said intermediate terminal.

3. The voltage circuit according to claim 1 wherein the current-absorption circuit comprises at least one transistor that is coupled between said circuit output terminal and ground.

4. The voltage according to claim 1 wherein the control circuit comprises a threshold comparator.

5. The voltage circuit according to claim 1, characterized in that the control circuit comprises first, second, third, and fourth transistors connected between said supply terminal and ground and each having first and second terminals and a control terminal, the control terminals of the first and second transistors composing said input terminals of the control circuit, the control terminals of the third and fourth transistors both connected to the first terminal of the first transistor and to the first terminal of the second transistor, and the first terminals of the third and fourth transistors connected to said output terminal of the control circuit.

6. A voltage generator for a memory circuit, comprising:
    an output node;
    first and second supply node;
    a voltage multiplier circuit coupled to said output node and to said first supply node, said multiplier circuit operable to generate on said output node a voltage that is higher than a supply voltage that is coupled to said first supply node;
    a voltage divider coupled between said output node and said second supply node, said voltage divider having a divider node;
    a controllable current-sink device having a control node, said device coupled between said output node and said second supply node; and
    a control circuit having an input coupled to said divider node and having an output coupled to said control node of the current-sink device, the control circuit causing the current-sink device to direct a current from the output node to said second supply node when a voltage on said divider node is greater than a predetermined value.

7. The voltage regulator circuit of claim 6 wherein the voltage divider, current-sink device, and control circuit are monolithically integrated.

8. The voltage regulator circuit of claim 6 wherein the voltage divider includes two serially coupled capacitors.

9. The voltage regulator circuit of claim 6 wherein the current-sink device comprises a first transistor.

10. The voltage regulator circuit of claim 9 wherein the control circuit comprises a threshold comparator circuit that receives a reference voltage having said predetermined value and compares the reference voltage to the voltage on the divider node and provides a control signal to activate said transistor when the voltage on the divider node is greater than the reference voltage.

11. The voltage regulator circuit of claim 9 wherein the control circuit includes an inverter and second and third serially coupled transistors, a control terminal of the second transistor receiving the voltage from the divider node and a control terminal of the third transistor receiving a reference voltage, a node between the second and third transistors being coupled to an input terminal of the inverter, and an output terminal of the inverter coupled to the first transistor and providing a control signal that causes the first transistor to become conducting when the voltage on the divider node is greater than said predetermined value.

12. The voltage generator of claim 6, further comprising a load coupled between said output node and said second supply node.

13. A method, comprising:
generating an output voltage on an output node from a supply voltage that is lower than said output voltage;
monitoring said output voltage; and
drawing a current from said output node to a supply node when said output voltage is greater than a first predetermined voltage level.

14. The method of claim 13 wherein:
said monitoring includes:
dividing said output voltage to generate an intermediate voltage, and
comparing said intermediate voltage to a reference voltage; and
said drawing includes sinking said current from said output node when said intermediate voltage is greater than said reference voltage.

15. The method of claim 13 wherein:
said monitoring comprises,
dividing said output voltage to generate an intermediate voltage, and
comparing said intermediate voltage to a second predetermined voltage level; and
wherein said drawing includes sinking said current from said output node when said intermediate voltage is greater than said second predetermined voltage level.

16. A circuit for providing a regulated and stepped-up voltage for a memory circuit, comprising:
first and second supply nodes;
a main output node;
a voltage step-up circuit having an output node coupled to said main output node and having a supply node coupled to said first supply node;
a voltage divider having a first intermediate node, a first element coupled between said main output and intermediate nodes, and a second element coupled between said intermediate node and said second supply node, said voltage divider operable to generate a control voltage on said intermediate node;
a capacitive element coupled between said main output node and said second supply node;
a switchable current sink having a control node and coupled in parallel to said capacitive element; and
a comparator circuit having a first input node and an output node, said input node coupled to said intermediate node of said voltage divider and said output node coupled to said control node of said switchable current sink.

17. The circuit of claim 18 wherein the comparator further includes:
a second input node coupled to receive a reference voltage;
first and second serially coupled transistors that are coupled together at a second intermediate node, said first transistor having a first control node coupled to said first input node, said second transistor having a second control node coupled to said second input node; and an inverter coupled between said second intermediate node and said output node of said comparator.

18. The circuit of claim 16 wherein said first and second elements comprise capacitors.

19. The circuit of claim 16 wherein said comparator activates said switchable current sink when said control voltage from said voltage divider exceeds a predetermined value.

20. The circuit of claim 16 wherein said step-up circuit generates an output voltage on said main output node that is higher than a supply voltage on said first supply node.

21. A circuit for providing an elevated and regulated voltage, said circuit comprising:
a supply node coupled to receive a supply voltage;
a main output node;
a ground node;
a voltage elevator circuit coupled to said main output node and said supply node, said elevator circuit operable to generate an output voltage on said main output node that is higher than said supply voltage;
a voltage divider having a first intermediate node, a first capacitor coupled between said main output and intermediate nodes, and a second capacitor coupled between said intermediate node and ground node;
a capacitive element coupled between said main output node and said ground node;
a switchable current sink coupled in parallel to said capacitive element, said current sink having a control node, said current sink operable to draw current from said main output node to said ground node when said output voltage is greater than a first predetermined value;
a comparator, comprising:
a first input node and an output node, said input node coupled to said first intermediate node and said output node coupled to said control terminal of said current sink,
a second input terminal coupled to receive a reference voltage,
first and second serially coupled transistors defining a second intermediate node therebetween, said first transistor having a first control terminal coupled to said first input node, said second transistor having a second control terminal coupled to said second input node; and
an inverter coupled between said second intermediate node and said output node of said comparator, and
wherein said comparator turns on said switchable current sink when a voltage on said first intermediate node exceeds a second predetermined value.

22. The circuit of claim 21, further comprising a load coupled across said main output and ground nodes.

\* \* \* \* \*